(12) United States Patent
Sutardja

(10) Patent No.: US 7,646,240 B2
(45) Date of Patent: *Jan. 12, 2010

(54) CLASS D AMPLIFIER

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 12/342,768

(22) Filed: Dec. 23, 2008

(65) Prior Publication Data

US 2009/0102556 A1   Apr. 23, 2009

Related U.S. Application Data

(63) Continuation of application No. 11/985,653, filed on Nov. 16, 2007, now Pat. No. 7,468,631, which is a continuation of application No. 11/702,728, filed on Feb. 6, 2007, now Pat. No. 7,298,209, which is a continuation of application No. 11/170,440, filed on Jun. 28, 2005, now Pat. No. 7,242,248, which is a continuation of application No. 10/703,135, filed on Nov. 6, 2003, now Pat. No. 7,190,224.

(51) Int. Cl.
  *H03F 1/04* (2006.01)
(52) U.S. Cl. .................. 330/207 A; 330/251; 330/10
(58) Field of Classification Search ............ 330/207 A, 330/251, 10
  See application file for complete search history.

(56) References Cited

U.S. PATENT DOCUMENTS 4,404,511 A   9/1983  Nola 4,415,862 A   11/1983  Kunugi (Continued)

FOREIGN PATENT DOCUMENTS

EP   0564490 B1   4/2001

(Continued)

OTHER PUBLICATIONS

Official Communication from the European Patent Office dated Dec. 15, 2005 for Application No. 04 011 557.8 - 2215; 4 pages.

(Continued)

*Primary Examiner*—Patricia Nguyen

(57) ABSTRACT

A Class D amplifier includes a ramp generator that generates a ramp signal and an inverted ramp signal. A signal generator generates first, second, third and fourth signals by comparing the ramp and inverted ramp signals to an input signal. A frequency of the ramp signal is approximately two orders of magnitude higher than a frequency of the input signal. The signal generator transitions from a first state to a second state of a first control signal after one of the first and second signals occurs, transitions from a first state to a second state of a second control signal after one of the third and fourth signals occurs, and transitions from the second state to the first state of one of the first and second control signals when the other of the first and second control signals transitions to the second state. An output stage includes first and second switches that are controlled based on the first and second control signals, respectively, and generates output current based on the first and second control signals.

11 Claims, 7 Drawing Sheets

U.S. PATENT DOCUMENTS

| | | | |
|---|---|---|---|
| 4,584,566 A | 4/1986 | Arcara | |
| 4,791,341 A | 12/1988 | Brown et al. | |
| 5,077,539 A | 12/1991 | Howatt | |
| 5,204,809 A | 4/1993 | Andersen | |
| 5,479,134 A * | 12/1995 | Nishioka et al. | 330/273 |
| 5,479,337 A | 12/1995 | Voigt | |
| 5,504,457 A | 4/1996 | Jensen | |
| 5,617,058 A | 4/1997 | Adrian et al. | |
| 5,955,910 A | 9/1999 | Levin et al. | |
| 6,049,473 A | 4/2000 | Jang et al. | |
| 6,348,781 B1 | 2/2002 | Midya et al. | |
| 6,362,986 B1 | 3/2002 | Schultz et al. | |
| 6,430,220 B1 | 8/2002 | Determan | |
| 6,552,607 B1 | 4/2003 | Danielson | |
| 6,847,257 B2 | 1/2005 | Edwards et al. | |
| 6,897,640 B2 | 5/2005 | Nebon et al. | |
| 6,922,101 B2 | 7/2005 | Bayko | |
| 6,952,131 B2 * | 10/2005 | Jeong et al. | 330/10 |
| 7,002,406 B2 * | 2/2006 | Risbo et al. | 330/10 |
| 7,190,224 B2 | 3/2007 | Sutardja | |
| 7,200,187 B2 | 4/2007 | O'Brien | |
| 7,242,248 B1 | 7/2007 | Sutardja | |
| 7,262,658 B2 | 8/2007 | Ramaswamy et al. | |
| 7,298,209 B1 | 11/2007 | Sutardja | |
| 7,378,904 B2 * | 5/2008 | Risbo | 330/10 |
| 7,417,412 B2 | 8/2008 | Koh | |

FOREIGN PATENT DOCUMENTS

| | | |
|---|---|---|
| WO | WO92/12572 | 7/1992 |
| WO | WO97/18626 | 5/1997 |
| WO | WO02/25817 A1 | 3/2002 |
| WO | WO03/043184 A1 | 5/2003 |

OTHER PUBLICATIONS

Nielsen K., "Parallel Phase Shifted Carrier Pulse Width Modulation (PSCPWM) - A Novel Approach to Switching Power Amplifier Design." Journal of the Audio Engineering Society, Audio Engineering Society, Mar. 22, 1997:1-26.

* cited by examiner

CLASS D AMPLIFIER

CROSS-REFERENCE TO RELATED APPLICATIONS

This application is a continuation of U.S. patent application Ser. No. 11/985,653, filed Nov. 16, 2007, which application is a continuation of U.S. patent application Ser. No. 11/702,728, filed Feb. 6, 2007, which application is a continuation of U.S. patent application Ser. No. 11/170,440 filed Jun. 28, 2005, which application is a continuation of U.S. patent application Ser. No. 10/703,135, filed Nov. 6, 2003. The disclosures of the above applications are incorporated herein by reference in their entirety.

FIELD OF THE INVENTION

The present invention relates to Class D amplifiers, and more particularly to an improved Class D amplifier.

BACKGROUND OF THE INVENTION

Amplifiers are typically used to amplify signals that are output to audio speakers, such as headphones, loudspeakers and/or other audio devices. In wired or non-portable applications, linear amplifiers such as Class A, Class B, and Class AB amplifiers have typically been used. Linear amplifiers include a linear output stage that draws a relatively high bias current while sourcing and sinking current into a load. Therefore, these linear amplifiers consume a relatively high amount of power. Because consumers buying portable audio equipment want to have longer battery life, linear amplifiers are not suitable for use in portable audio applications.

Class D amplifiers have a nonlinear output stage that does not require the high bias current that is used in the linear amplifiers. The increase in efficiency of the output stage, however, is gained at the cost of increased noise and/or distortion. The tradeoff between power consumption and distortion and/or noise has generally been found to be acceptable in portable audio equipment applications.

Referring now to FIGS. 1 and 2, an exemplary Class D amplifier 10 is shown to include a sawtooth waveform generator 14. As can be seen in FIG. 2, a sawtooth signal $V_{saw}$ includes a positive sloped portion that increases from a minimum value to a maximum value followed by a return to the minimum value with an almost-infinite negative slope. The sawtooth signal $V_{saw}$ is input to an inverting input of a comparator 18. An input signal $V_{IN}$ such as an audio signal is input to a non-inverting input of the comparator 18.

An output of the comparator 18 is input to first and second transistors 20 and 22 that are operated as switches. In this example, the first transistor 20 is a PMOS transistor and the second transistor 22 is an NMOS transistor. The output of the comparator 18 is also inverted by an inverter 24 and input to third and fourth transistors 26 and 28 that are also operated as switches. In this example, the third transistor 26 is a PMOS transistor and the fourth transistor 28 is an NMOS transistor.

Referring now to FIG. 2, the sawtooth signal $V_{saw}$ is compared to the input signal $V_{IN}$. When the input signal $V_{IN}$ is greater than the sawtooth signal $V_{saw}$, the output is high. When the input signal $V_{IN}$ is less than the sawtooth signal $V_{saw}$, the output is low. Alternately, when the input signal $V_{IN}$ is greater than the sawtooth signal $V_{saw}$, the output is low. When the input signal $V_{IN}$ is less than the sawtooth signal $V_{saw}$, the output is high. The transistors 20, 22, 26 and 28 are switched on and off to drive current through a load 40 as depicted in FIG. 1.

SUMMARY OF THE INVENTION

A Class D amplifier according to the present invention receives an input signal and comprises a signal generator that generates first and second periodic signals. Each period of the first periodic signal comprises first and second intervals, and each period of the second periodic signal comprises third and fourth intervals. The first periodic signal is monotonically increasing during the first interval and is monotonically decreasing during the second interval, the second periodic signal is monotonically decreasing during the third interval and is monotonically increasing during the fourth interval. The first and third intervals are substantially aligned in time, and the second and fourth intervals are substantially aligned in time. The Class D amplifier further comprises a crossing detector that generates a first transition signal when a voltage of the first periodic signal transitions in a first direction across a voltage of the input signal and when a voltage of the second periodic signal transitions in the first direction across a voltage of the input signal.

In other features, the first and second periodic signals are characterized by substantially equal periods and substantially equal peak-to-peak amplitudes. The second periodic signal is substantially equal to the first periodic signal phase-shifted by 180 degrees. The second periodic signal is substantially equal to the first periodic signal mirrored across a horizontal constant voltage line. A frequency of the first periodic signal is at least approximately two orders of magnitude higher than a frequency of the input signal. A frequency of the first periodic signal is at least approximately two orders of magnitude higher than a maximum frequency of the input signal.

In still other features, derivatives of the first periodic signal during the first and second intervals are approximately equal in magnitude, and derivatives of the second periodic signal during the third and fourth intervals are approximately equal in magnitude. The crossing detector generates a second transition signal when a voltage of the first periodic signal transitions in a second direction across a voltage of the input signal and when a voltage of the second periodic signal transitions in the second direction across a voltage of the input signal, wherein the second direction is opposite to the first direction.

In other features, the first direction is a positive transition from lower than the input signal to higher than the input signal, and the second direction is a negative transition from higher than the input signal to lower than the input signal. The first direction is a negative transition from higher than the input signal to lower than the input signal, and the second direction is a positive transition from lower than the input signal to higher than the input signal. The crossing detector comprises an edge detector. The edge detector comprises first and second comparators that compare the input signal to the first and second periodic signals, respectively.

In still other features, the edge detector generates a first pulse when a rising edge occurs in at least one of first and second comparator outputs, and generates a second pulse when a falling edge occurs in at least one of the first and second comparator outputs. The edge detector comprises a first one shot that receives an output of the first comparator and that generates the first pulse when a rising edge occurs, a second one shot that receives an output of the first comparator and that generates the second pulse when a falling edge occurs, a third one shot that receives an output of the second comparator and that generates the first pulse when a rising edge occurs, and a fourth one shot that receives an output of the second comparator and that generates the second pulse when a falling edge occurs.

In other features, the first transition signal includes the first pulse and the second transition signal includes the second pulse. The Class D amplifier further comprises a phase detector that asserts an up signal when the first transition signal is received, asserts a down signal when the second transition signal is received, and de-asserts both of the up and down signals after a predetermined period. The phase detector de-asserts both of the up and down signals after both of the up and down signals have been asserted for a predetermined period. The phase detector delays the down signal before asserting the down signal.

The Class D amplifier further comprises an output stage that receives the up and down signals from the phase detector and that selectively drives output current based on the up and down signals. In still other features, the output stage drives output current in a first current direction when the up signal is asserted, and drives output current in a direction opposite to the first current direction when the down signal is asserted. The Class D amplifier further comprises an output stage that selectively drives output current based upon first and second current signals.

In other features, the first and second current signals are derived from the first and second transition signals. The first and second current signals are asserted when the first and second transition signals, respectively, are asserted, and the first and second current signals are both de-asserted when the first and second current signals have been asserted simultaneously for a predetermined period. The second current signal is delayed by a predetermined time. The output stage includes a single-ended drive stage. The output stage includes first and second single-ended drive stages, the first single-ended drive stage drives output current when the first current signal is asserted, and the second single-ended drive stage drives output current when the second current signal is asserted.

In still other features, the output stage connects an output terminal to a first reference potential when the first current signal is asserted and connects the output terminal to a second potential when the second current signal is asserted, and wherein the first reference potential is greater than the second reference potential. The output stage connects the output terminal to a third reference potential when the first and second current signals are both de-asserted, wherein the third reference potential is less than the first reference potential and greater than the second reference potential. The output stage includes a balanced H-bridge.

In other features, the output stage connects a first output terminal to a first reference potential and a second output terminal to a second reference potential when the first current signal is asserted, and connects the first output terminal to the second reference potential and the second output terminal to the first reference terminal when the second current signal is asserted, and wherein the first reference potential is greater than the second reference potential. The output stage connects the first and second output terminals together when the first and second current signals are both de-asserted.

A system comprises the Class D amplifier and further comprises a load that receives the output current. In other features, the load comprises an audio speaker. A low pass filter is arranged between the output stage and the load.

A method for operating a Class D amplifier that receives an input signal comprises generating first and second periodic signals wherein each period of the first periodic signal comprises first and second intervals, and each period of the second periodic signal comprises third and fourth intervals. The first periodic signal is monotonically increasing during the first interval and is monotonically decreasing during the second interval, the second periodic signal is monotonically decreasing during the third interval and is monotonically increasing during the fourth interval. The first and third periods are substantially aligned in time, and the second and fourth periods are substantially aligned in time. The method includes generating a first transition signal when a voltage of the first periodic signal transitions in a first direction across a voltage of the input signal and when a voltage of the second periodic signal transitions in the first direction across a voltage of the input signal.

In other features, the first and second periodic signals are characterized by substantially equal periods and substantially equal peak-to-peak amplitudes. A frequency of the first periodic signal is at least approximately two orders of magnitude higher than a frequency of the input signal. Derivatives of the first periodic signal during the first and second intervals are approximately equal in magnitude, and wherein derivatives of the second periodic signal during the third and fourth intervals are approximately equal in magnitude.

In still other features, the method further comprises generating a second transition signal when a voltage of the first periodic signal transitions in a second direction across a voltage of the input signal and when a voltage of the second periodic signal transitions in the second direction across a voltage of the input signal, wherein the second direction is opposite to the first direction. The method further comprises asserting an up signal when the first transition signal is received, asserting a down signal when the second transition signal is received, and de-asserting both of the up and down signals after a predetermined period.

In other features, the method further comprises delaying the down signal, driving output current based on the up and down signals, and driving output current in a first current direction when the up signal is asserted, and driving output current in a direction opposite to the first current direction when the down signal is asserted. The method further comprises low pass filtering the output current.

A Class D amplifier that receives an input signal comprises signal generating means for generating first and second periodic signals wherein each period of the first periodic signal comprising first and second intervals, and each period of the second periodic signal comprising third and fourth intervals. The first periodic signal is monotonically increasing during the first interval and is monotonically decreasing during the second interval, the second periodic signal is monotonically decreasing during the third interval and is monotonically increasing during the fourth interval. The first and third intervals are substantially aligned in time, and the second and fourth intervals are substantially aligned in time. The Class D amplifier includes crossing detecting means for generating a first transition signal when a voltage of the first periodic signal transitions in a first direction across a voltage of the input signal and when a voltage of the second periodic signal transitions in the first direction across a voltage of the input signal.

In other features, the first and second periodic signals are characterized by substantially equal periods and substantially equal peak-to-peak amplitudes. The second periodic signal is substantially equal to the first periodic signal phase-shifted by 180 degrees. The second periodic signal is substantially equal to the first periodic signal mirrored across a horizontal constant voltage line. A frequency of the first periodic signal is at least approximately two orders of magnitude higher than a frequency of the input signal.

In still other features, a frequency of the first periodic signal is at least approximately two orders of magnitude higher than a maximum frequency of the input signal. Derivatives of the first periodic signal during the first and second intervals are approximately equal in magnitude, and wherein derivatives of the second periodic signal during the third and fourth intervals are approximately equal in magnitude. The crossing detecting means generates a second transition signal when a voltage of the first periodic signal transitions in a second direction across a voltage of the input signal and when a voltage of the second periodic signal transitions in the second direction across a voltage of the input signal, and wherein the second direction is opposite to the first direction.

In other features, the first direction is a positive transition from lower than the input signal to higher than the input signal, and the second direction is a negative transition from higher than the input signal to lower than the input signal. The first direction is a negative transition from higher than the input signal to lower than the input signal, and the second direction is a positive transition from lower than the input signal to higher than the input signal. The crossing detecting means comprises edge detecting means for finding crossing points of the input signal and the first and second periodic signals.

In still other features, the edge detecting means comprises first and second comparison means for comparing the input signal to the first and second periodic signals, respectively. The edge detecting means generates a first pulse when a rising edge occurs in at least one of first and second comparison means outputs, and generates a second pulse when a falling edge occurs in at least one of the first and second comparison means outputs.

In other features, the edge detecting means comprises first one shot means for receiving an output of the first comparison means and for generating the first pulse when a rising edge occurs, second one shot means for receiving an output of the first comparison means and for generating the second pulse when a falling edge occurs, third one shot means for receiving an output of the second comparison means and for generating the first pulse when a rising edge occurs, and fourth one shot means for receiving an output of the second comparison means and for generating the second pulse when a falling edge occurs. The first transition signal includes the first pulse and the second transition signal includes the second pulse.

In still other features, the Class D amplifier further comprises phase detecting means for asserting an up signal when the first transition signal is received, asserting a down signal when the second transition signal is received, and de-asserting both of the up and down signals after a predetermined period. The phase detecting means de-asserts both of the up and down signals after both of the up and down signals have been asserted for a predetermined period. The phase detecting means delays the down signal before asserting the down signal.

In other features, the Class D amplifier further comprises output means for selectively driving output current based on the up and down signals. The output means drives output current in a first current direction when the up signal is asserted, and drives output current in a direction opposite to the first current direction when the down signal is asserted. The Class D amplifier further comprises output means for selectively driving output current based upon first and second current signals. The first and second current signals are derived from the first and second transition signals.

In still other features, the first and second current signals are asserted when the first and second transition signals, respectively, are asserted, and the first and second current signals are both de-asserted when the first and second current signals have been asserted simultaneously for a predetermined period. The second current signal is delayed by a predetermined time. The output means includes single-ended driving means. The output means includes first single-ended driving means for driving output current when the first current signal is asserted, and second single-ended driving means for driving output current when the second current signal is asserted.

In other features, the output means connects an output terminal to a first reference potential when the first current signal is asserted and connects the output terminal to a second potential when the second current signal is asserted, and wherein the first reference potential is greater than the second reference potential. The output means connects the output terminal to a third reference potential when the first and second current signals are both de-asserted, wherein the third reference potential is less than the first reference potential and greater than the second reference potential. The output means includes a balanced H-bridge.

In still other features, the output means connects a first output terminal to a first reference potential and a second output terminal to a second reference potential when the first current signal is asserted, and connects the first output terminal to the second reference potential and the second output terminal to the first reference terminal when the second current signal is asserted, and wherein the first reference potential is greater than the second reference potential. The output means connects the first and second output terminals together when the first and second current signals are both de-asserted.

In other features, a system comprises the Class D amplifier and load means that receives the output current. The load means comprises audio speaker means. The system further comprises filtering means for low-pass filtering the output current.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
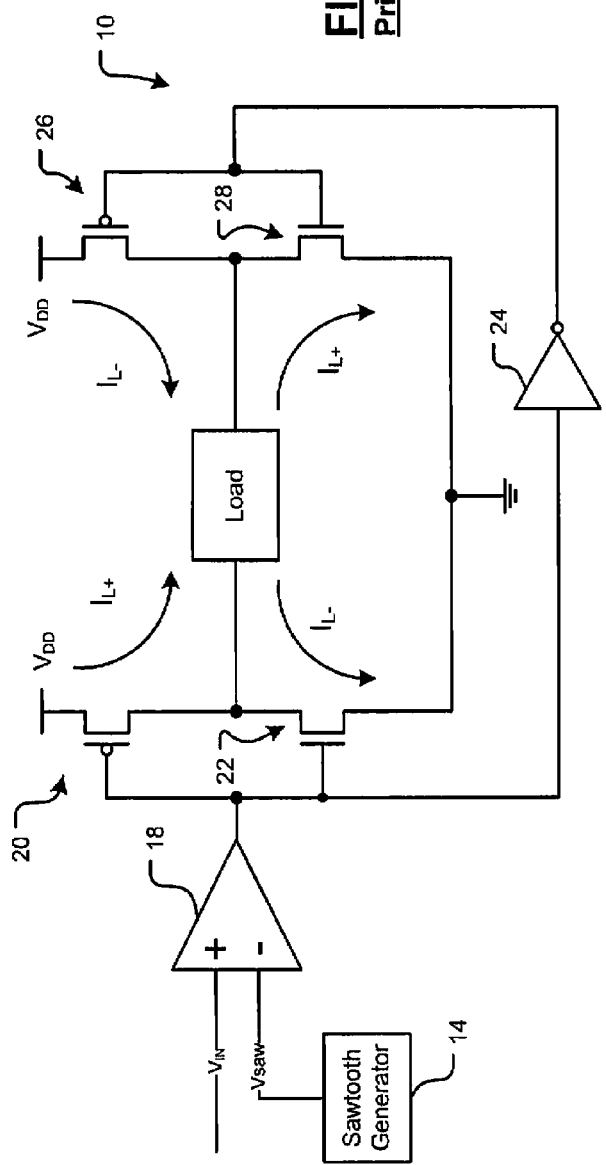
FIG. 1 is an electrical schematic of a Class D amplifier according to the prior art.
Figure 2:
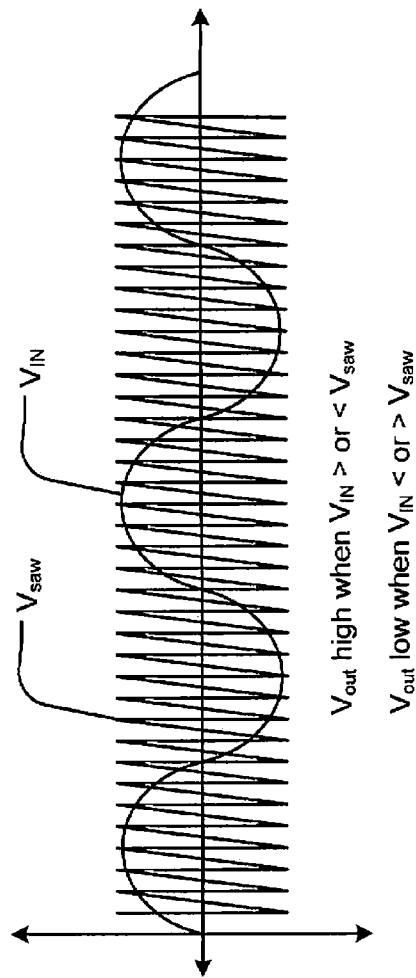
FIG. 2 is a waveform diagram illustrating a sawtooth signal $V_{saw}$ and an input signal $V_{IN}$ according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 3:
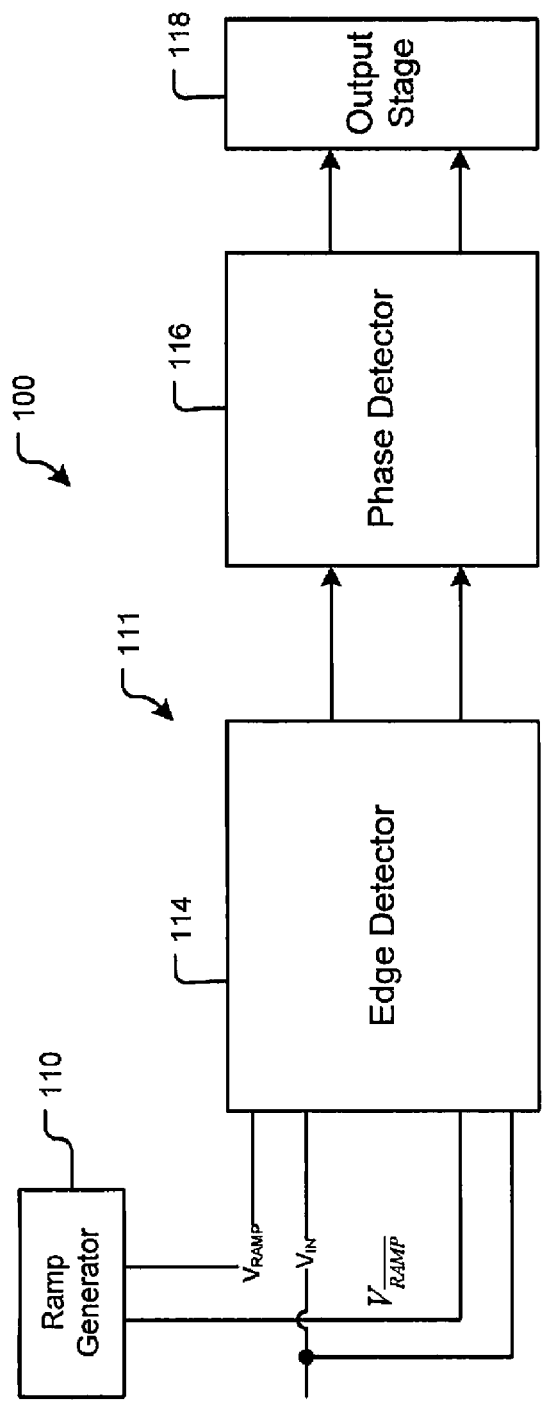
FIG. 3 is a functional block diagram of a Class D amplifier according to the present invention.

Referring now to FIG. 3, a Class D amplifier 100 according to the present invention is shown. The Class D amplifier 100 includes a ramp generator 110 that generates a ramp signal ($V_{RAMP}$) and an inverted ramp signal ($V_{\overline{RAMP}}$). As used herein, the terms ramp signal and inverted ramp signal refer to signals having alternating positive and negative slopes, which are substantially equal. The ramp signal $V_{RAMP}$ is output to a signal generator 111 that generates UP and DOWN signals for an output stage 118. The output stage 118 drives current through the load based on the UP and DOWN signals. The signal generator 111 includes an edge detector 114 and a phase detector 116. The ramp signal $V_{RAMP}$, the inverted ramp signal $V_{\overline{RAMP}}$ and the input signal $V_{IN}$ are output to the edge detector circuit 114.

The edge detector circuit 114 outputs first and second pulses when rising and falling edges of the ramp and inverted ramp signals transition above and below, respectively, the input signal. In other words, the edge detector circuit 114 outputs a first pulse when $V_{RAMP}$ transitions from a value less than $V_{IN}$ to a value greater than $V_{IN}$ and a second pulse when $V_{RAMP}$ transitions from a value greater than $V_{IN}$ to a value less than $V_{IN}$, respectively. The edge detector circuit 114 also outputs the first pulse when $V_{\overline{RAMP}}$ transitions from a value less than $V_{IN}$ to a value greater than $V_{IN}$ and the second pulse when $V_{\overline{RAMP}}$ transitions from a value greater than $V_{IN}$ to a value less than $V_{IN}$, respectively.

Outputs of the edge detector circuit 114 are input to a phase detector 116. The phase detector 116 sends an UP signal when the first pulse is received until the second pulse is received. When the second pulse is received, the phase detector 116 sends a DOWN signal until the first pulse is received. An output of the phase detector 116 is transmitted to an output stage 118, which drives current across the load based on the UP and DOWN signals.

Figure 4:
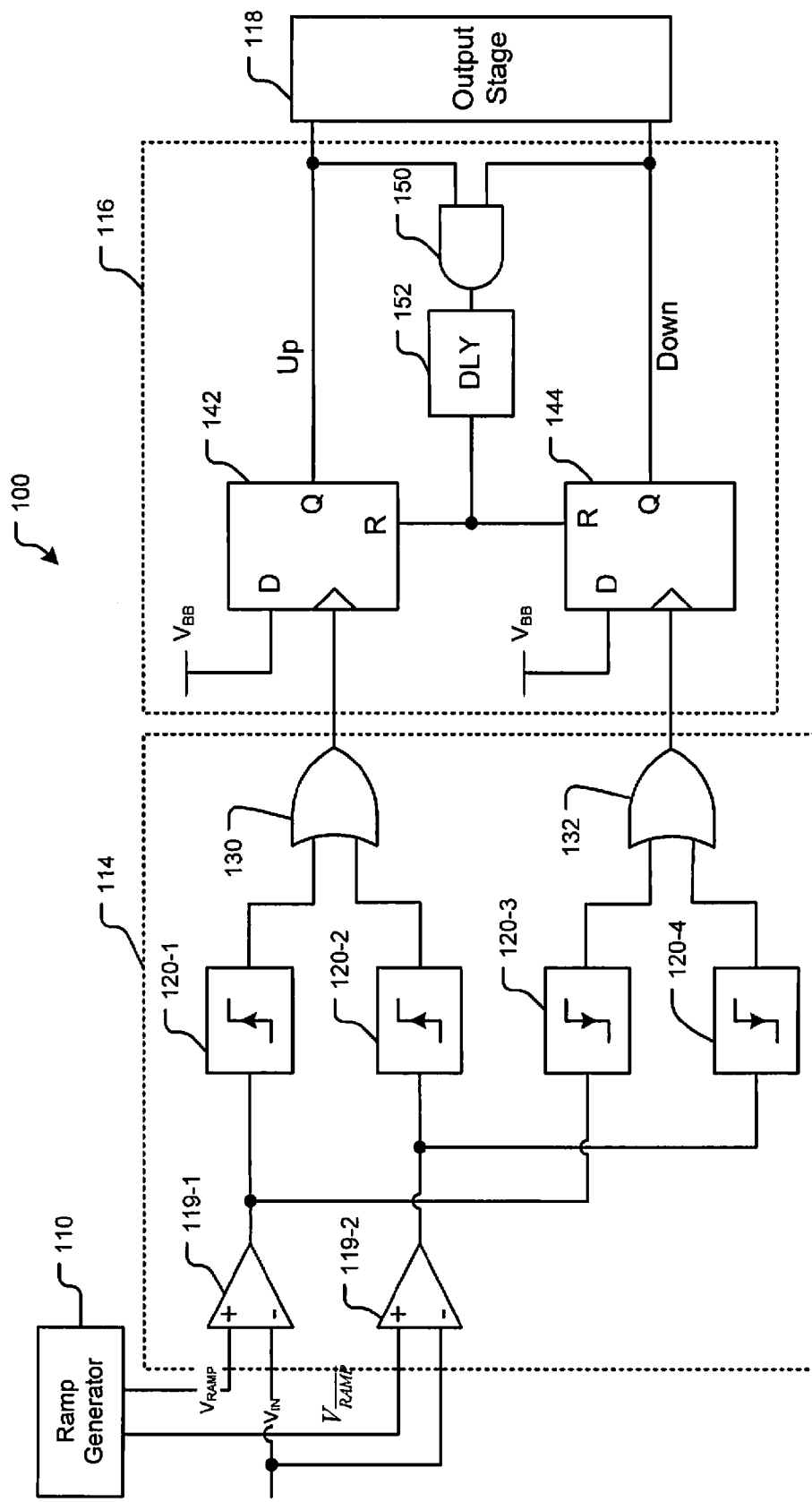
FIG. 4 is an electrical schematic of one exemplary implementation of the Class D amplifier of FIG. 3.

Referring now to FIG. 4, an exemplary implementation of the Class D amplifier 100 is shown. The edge detector circuit 114 includes comparators 119-1 and 119-2 and one-shot circuits 120-1 and 120-3 and 120-2 and 120-4, respectively. The ramp signal $V_{RAMP}$ is output to a non-inverting input of the first comparator 119-1. The inverted ramp signal $V_{\overline{RAMP}}$ is output to a non-inverting input of the second comparator 119-2. The input signal $V_{IN}$ is input to inverting inputs of the comparators 119-1 and 119-2.

Outputs of the comparators 119-1 and 119-2 are input to the one-shot circuits 120. In one implementation, the one-shot circuits 120-1 and 120-2 generate an output pulse when there is a positive edge sensed at the input thereof. The one-shot circuits 120-3 and 120-4 generate an output pulse when there is a negative edge sensed at the input thereof.

Outputs of the one-shot circuits 120-1 and 120-2 are input to OR gate 130. Outputs of the one-shot circuits 120-3 and 120-4 are input to OR gate 132. Outputs of the OR gates 130 and 132 are input to a phase detector 116. The phase detector 116 operates in a manner that is similar to phase detectors in modern phase locked loops (PLLs). When there is no phase error in modern PLLs, a very small up and down pulse current is generated. In a Class D amplifier, however, voltage pulses are used instead of current.

In one implementation, the phase detector 116 includes a flip-flop 142 that communicates with the output of the OR gate 130 and a flip-flop 144 that communicates with the output of the OR gate 132. D inputs of the flip-flops 142 and 144 are connected to a voltage bias $V_{BB}$. A Q output of the flip-flop 142 provides a first or UP signal. A Q output of the flip-flop 144 provides a second or DOWN signal. The UP signal and the DOWN signal are fed back through an AND gate 150 and a delay 152 to reset (R) inputs of the flip-flops 142 and 144. The UP signal and the DOWN signal are also transmitted to an output stage 118, as will be described below. The ramp signal preferably has a frequency that is 2 orders of magnitude higher than the input frequency (e.g. 20 kHz and 1-2 MHz).

Figure 5:
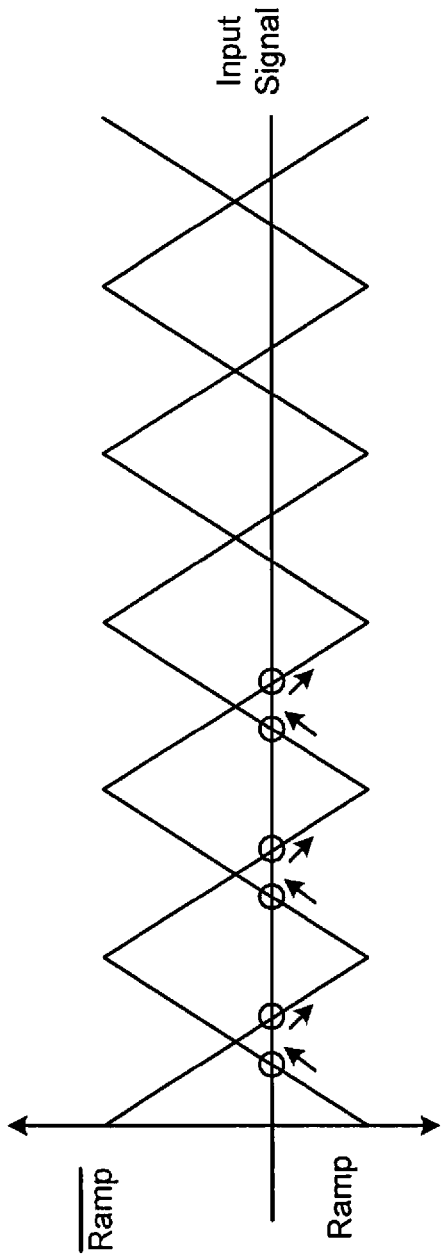
FIG. 5 is a waveform diagram of a ramp signal $V_{RAMP}$ and an input signal $V_{IN}$ according to the present invention.

Referring now to FIG. 5, the ramp signal $V_{RAMP}$, the inverted ramp signal $V_{\overline{RAMP}}$, and an input signal $V_{IN}$ are shown. The UP signal is initiated on a rising edge of either the ramp signal $V_{RAMP}$ or the inverted ramp signal $V_{\overline{RAMP}}$ crossing the input signal $V_{IN}$. The DOWN signal is initiated on a falling edge of either the ramp signal $V_{RAMP}$ or the inverted ramp signal $V_{\overline{RAMP}}$ crossing the input signal $V_{IN}$.

Figure 6:
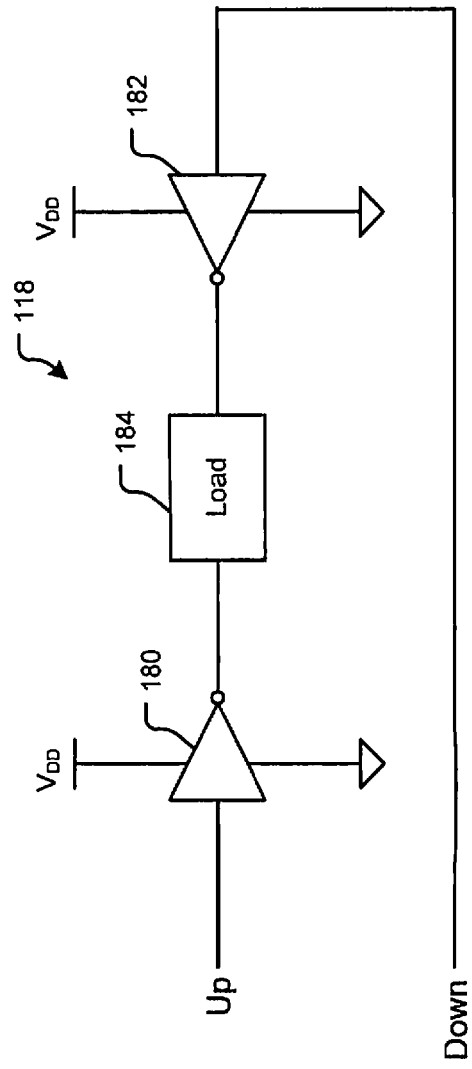
FIG. 6 illustrates an exemplary output stage of the Class D amplifier according to the present invention.

Referring now to FIG. 6, an exemplary output stage 118 includes an amplifier 180 that is switched on when the UP signal has a first state and off when the UP signal has a second state. The amplifier 182 is switched on when the DOWN signal has a first state and off when the UP signal has a second state.

Figure 7:
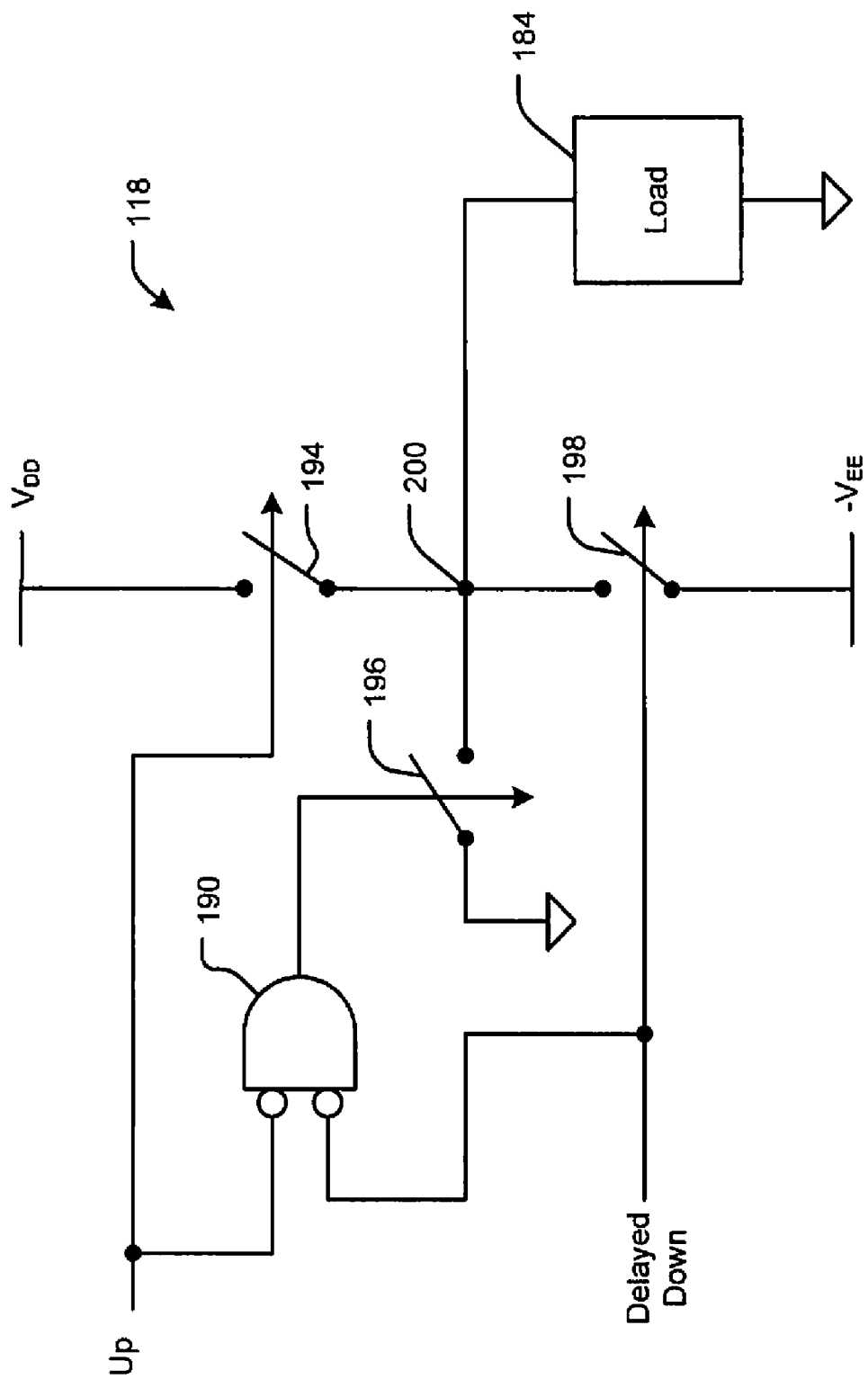
FIG. 7 illustrates a single ended output stage for the Class D amplifier according to the present invention.

Referring now to FIG. 7, an alternate output stage 118 is configured as a single ended drive stage. The output stage 118 includes an AND gate 190 with inverted inputs, which are connected to the UP signal and a delayed DOWN signal. The UP signal controls a first switch 194. An output of the AND gate 190 controls a second switch 196. The first switch 194 selectively connects $V_{DD}$ to a node 200. The second switch 196 selectively connects the node 200 to ground. The delayed DOWN signal controls a third switch 198, which selectively connects the node 200 to negative $V_{EE}$. The load 184 is connected between the node 200 and ground.

In a preferred embodiment, the DOWN signal is delayed by at least the minimum pulse width of the phase detector 116 to avoid conflict between the switches 194 and 198. In a preferred embodiment, the delay is preferably at least two times the minimum delay described above. The switch 196 is on only when the UP and the delayed DOWN signals are inactive. In PLL applications, the DOWN signal does not need to be delayed because current is used. Therefore UP and DOWN signals can occur at the same time. With voltage signals, the DOWN signal is preferably delayed to avoid the crowbar short-circuit effect of both the top and bottom transistors being on.

Figure 8:
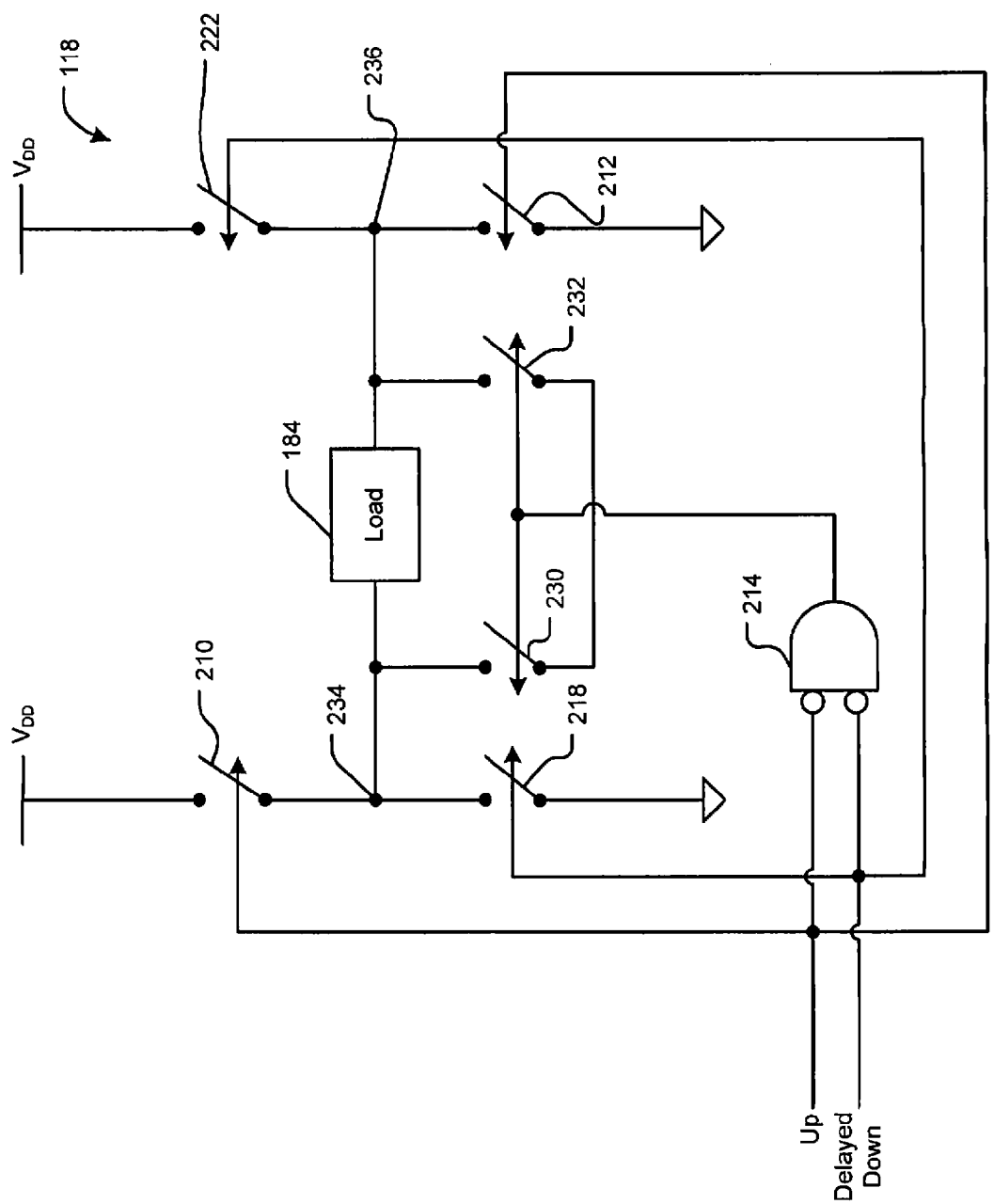
FIG. 8 illustrates a balanced H-bridge output stage for the Class D amplifier according to the present invention.

Referring now to FIG. 8, an alternate output stage 118 is configured as a balanced H-bridge implementation. The UP signal controls first and second switches 210 and 212 and is input to an AND gate 214 with inverted inputs. The delayed DOWN signal controls switches 218 and 222 and is input to AND gate 214, which has inverted inputs. The output of the AND gates 214 controls switches 230 and 232, which are connected across the load 184. The switches 210 and 222 are connected between $V_{DD}$ and nodes 234 and 236, respectively. The switches 218 and 212 are connected between the nodes 234 and 236, respectively, and ground.

Figure 9:
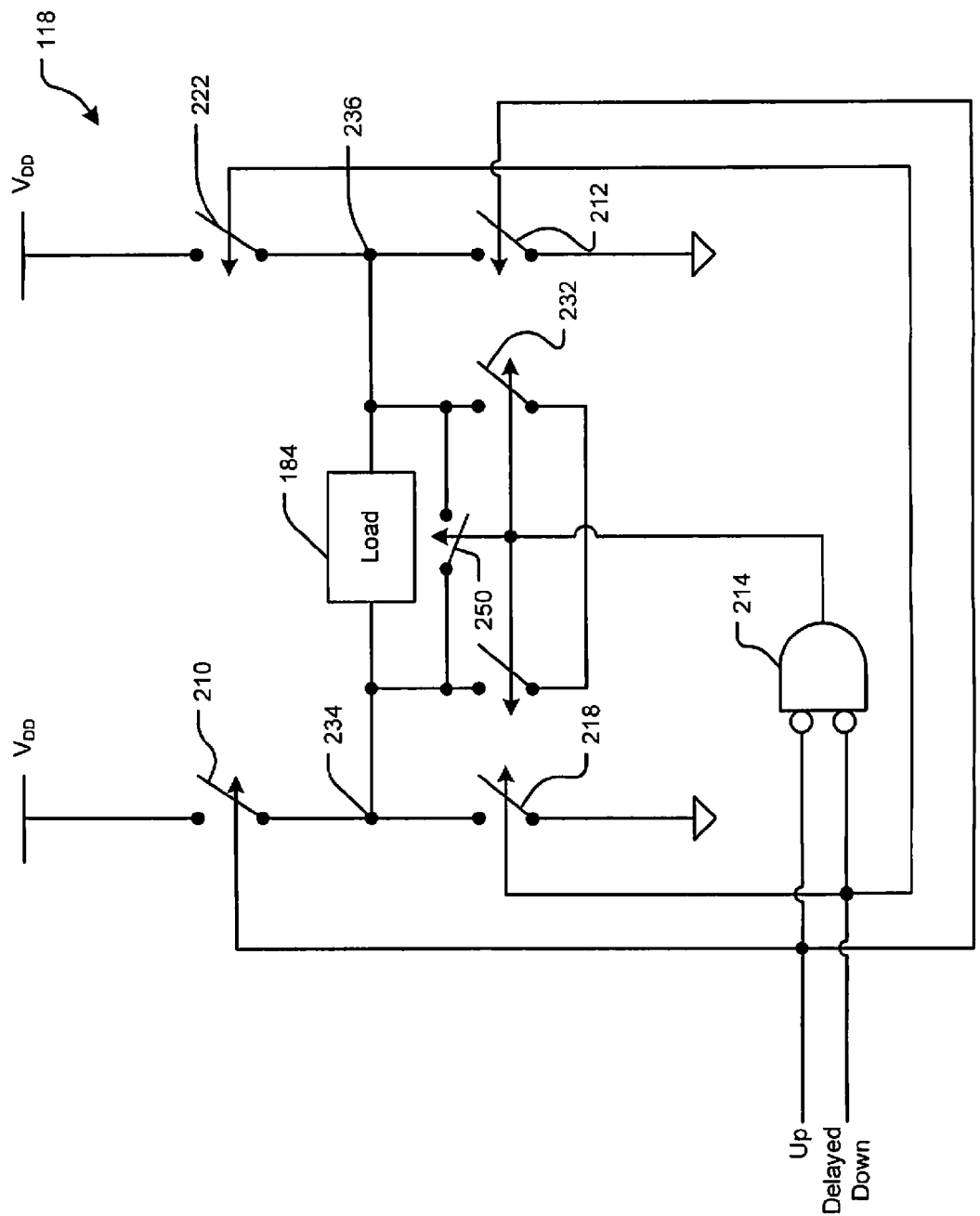
FIG. 9 illustrates an alternate balanced H-bridge output stage for the Class D amplifier according to the present invention.

Referring now to FIG. 9, an alternate output stage 118 that is similar to the output stage in FIG. 8 is shown. The output stage 118 in FIG. 9 includes an additional switch 250 that is controlled by the output of the AND gate 214. The switch 250 is connected across the load 184.

As can be appreciated, the output common mode of the output stages 118 that are shown in FIGS. 8 and 9 does not move around and is centered between the positive and negative power supplies.

Figure 10:
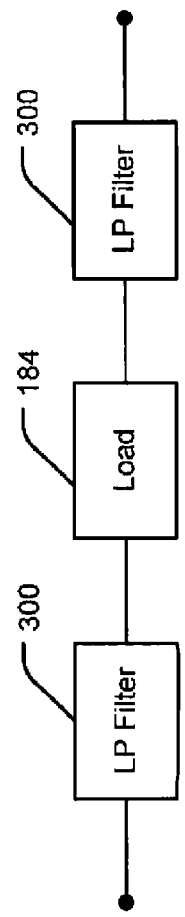
FIG. 10 illustrates low pass filters of the Class D amplifier and the load.

Referring now to FIG. 10, the signal to the load 184 can be filtered using one or more low pass filter circuits 300. The low pass filter circuits 300 may include one or more inductors and/or capacitors that remove high frequency switching components. For example, the filter may include a series inductor and a parallel capacitor. The optional filters 300 may not be needed if the load is an inductive load such as a loudspeaker load, which is mechanically similar to a low pass filter.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A Class D amplifier comprising:
    a ramp generator that generates a ramp signal and an inverted ramp signal;
    a signal generator that generates first, second, third and fourth signals by comparing the ramp and inverted ramp signals to an input signal, wherein a frequency of the ramp signal is approximately two orders of magnitude higher than a frequency of the input signal,
    wherein the signal generator transitions from a first state to a second state of a first control signal after one of the first and second signals occurs, transitions from a first state to a second state of a second control signal after one of the third and fourth signals occurs, and transitions from the second state to the first state of one of the first and second control signals when the other of the first and second control signals transitions to the second state; and
    an output stage that includes first and second switches that are controlled based on the first and second control signals, respectively, and that generates output current based on the first and second control signals.

2. The Class D amplifier of claim 1 wherein the signal generator comprises an edge detector.

3. The Class D amplifier of claim 1 wherein the signal generator comprises a phase detector.

4. The Class D amplifier of claim 2 wherein the edge detector comprises:
    a first comparator that compares the ramp signal to the input signal; and
    a second comparator that compares the inverted ramp signal to the input signal.

5. The Class D amplifier of claim 4 wherein the edge detector generates the first and second signals when rising edges occur in outputs of the first and second comparators, respectively, and generates the third and fourth signals when falling edges occur in the outputs of the first and second comparators.

6. The Class D amplifier of claim 5 wherein the edge detector comprises:
    a first one shot that receives an output of the first comparator and that generates the first signal when a rising edge occurs;
    a second one shot that receives an output of the first comparator and that generates the second signal when a falling edge occurs;
    a third one shot that receives an output of the second comparator and that generates the first signal when a rising edge occurs; and
    a fourth one shot that receives an output of the second comparator and that generates the second signal when a falling edge occurs.

7. The Class D amplifier of claim 1 wherein the output stage includes a balanced H-bridge.

8. A system comprising the Class D amplifier of claim 1 and further comprising a load that receives the output current.

9. The system of claim 8 wherein the load comprises an audio speaker.

10. The system of claim 8 wherein the Class D amplifier further comprises a low pass filter that is arranged between the output stage and the load.

11. The Class D amplifier of claim 1 wherein the signal generator generates the first and second signals after the ramp and inverted ramp signals, respectively, exceed the input signal and generates the third and fourth signals after the ramp and inverted ramp signals, respectively, fall below the input signal.

* * * * *